United States Patent
Casper et al.

(10) Patent No.: US 6,608,582 B2
(45) Date of Patent: Aug. 19, 2003

(54) A/D CONVERSION USING A VARIABLE OFFSET COMPARATOR

(75) Inventors: Bryan K. Casper, Hillsboro, OR (US); Aaron K. Martin, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 3 days.

(21) Appl. No.: 10/037,751

(22) Filed: Jan. 2, 2002

(65) Prior Publication Data

US 2003/0001762 A1 Jan. 2, 2003

Related U.S. Application Data

(63) Continuation-in-part of application No. 09/967,804, filed on Sep. 28, 2001, which is a continuation-in-part of application No. 09/895,625, filed on Jun. 29, 2001, now Pat. No. 6,420,932.

(51) Int. Cl.[7] .................................................. H03M 1/12
(52) U.S. Cl. ........................ 341/155; 341/118; 341/120; 341/161; 341/162; 341/163
(58) Field of Search .................................. 341/118, 120, 341/155, 161, 162, 163; 326/82, 30, 86

(56) References Cited

U.S. PATENT DOCUMENTS

| | | | | |
|---|---|---|---|---|
| 4,399,426 A | * | 8/1983 | Tan | 341/120 |
| 4,754,169 A | * | 6/1988 | Morris | 327/307 |
| 4,829,302 A | * | 5/1989 | Oitzl et al. | 341/165 |
| 4,940,983 A | * | 7/1990 | Phillips et al. | 341/163 |
| 4,983,969 A | * | 1/1991 | Iwamoto et al. | 341/118 |
| 4,987,327 A | * | 1/1991 | Fernandez et al. | 327/543 |
| 5,252,976 A | * | 10/1993 | Miho et al. | 341/163 |
| 5,471,208 A | * | 11/1995 | Sauer | 341/120 |
| 5,563,598 A | * | 10/1996 | Hickling | 341/155 |
| 5,581,252 A | * | 12/1996 | Thomas | 341/144 |
| 5,684,487 A | * | 11/1997 | Timko | 341/120 |
| 5,870,052 A | * | 2/1999 | Dedic et al. | 341/161 |
| 6,181,268 B1 | * | 1/2001 | Miyake et al. | 341/161 |
| 6,329,938 B1 | * | 12/2001 | Spaur et al. | 341/118 |
| 6,348,882 B1 | | 2/2002 | Ciccone et al. | |
| 6,388,521 B1 | * | 5/2002 | Henry | 330/258 |

* cited by examiner

Primary Examiner—Michael Tokar
Assistant Examiner—Khai Nguyen

(57) ABSTRACT

An A/D conversion reference level is applied to an input of a variable offset comparator (i.e. VOC). A binary number that corresponds to the A/D conversion reference level is determined by changing a binary variable that is applied to vary the offset of the VOC until the VOC output changes states. The same procedure is applied to determine corresponding reference, binary numbers for all of the other A/D conversion reference levels. A successive approximation procedure (binary search) is then performed for a reference window in which an input analog level (to be converted into digital form) would fall, by successively applying the reference binary numbers to vary the VOC offset.

19 Claims, 6 Drawing Sheets

A/D CONVERSION USING A VARIABLE OFFSET COMPARATOR

The present application is a continuation-in-part of Ser. No. 09/967,804, now allowed U.S. Pat. No. 6,420,932, "Equalization of a Transmission Line Signal Using a Variable Offset Comparator, filed Sep. 28, 2001, which is a continuation-in-part of Ser. No. 09/895,625, "Variable Offset Amplifier Circuit", filed Jun. 29, 2001.

The present application may be related to subject matter disclosed in or more of the following applications that are assigned to the same assignee as that of the present application:

U.S. patent application Ser. No. 09/968,349, "Multi-Level Receiver Circuit With Digital Output Using a Variable Offset Comparator, filed Sep. 28, 2001.

U.S. patent application Ser. No. 09/967,666, "Voltage Margin Testing of a Transmission Line Analog Signal Using a Variable Offset Comparator in a Data Receiver Circuit, filed Sep. 28, 2001.

BACKGROUND

This invention is in general related to analog to digital (i.e., A/D) converters and more particularly to successive approximation A/D converters.

A/D converters are used to convert an input analog voltage into an output digital (or binary) value. There are a number of different, known A/D conversion techniques, each having certain advantages which make it suitable for a particular application. In the successive approximation technique, the input, analog voltage is successively compared to some of a number of predefined, reference voltages using a comparator. The comparator has inverting and non-inverting voltage inputs, where one is to receive the input, analog voltage and the other is to successively receive some of the reference voltages. These reference voltages are typically evenly spaced between a lower voltage and an upper voltage (which are typically the voltages of the power supply and return nodes, respectively, used by the A/D converter), to define a number of non-overlapping voltage windows between the lower and upper voltages. Each voltage window is assigned a unique, digital value. A goal of the comparison process is to determine which voltage window contains the input, analog voltage, by performing a binary search. Each cycle of the search yields one bit, starting with the most significant bit, and with each cycle moves closer to the voltage window that contains the input voltage. The digital value assigned to this window is thus the output, digital value that represents the conversion of the input, analog voltage.

DETAILED DESCRIPTION

An A/D conversion process and an A/D converter are described which use a variable offset comparator (i.e., VOC). According to an embodiment, the VOC has a substantially variable, digitally controllable offset and can be implemented using a standard, digital complimentary metal oxide semiconductor (i.e. CMOS) fabrication process, on the same integrated circuit chip as large scale integration logic. Use of the VOC with digitally controllable offset permits easy calibration of the A/D conversion process, to cancel inaccuracy inducing effects such as device mismatch and comparator offsets. Additionally, power consumption may be reduced in the A/D converter since the VOC does not require the analog, A/D conversion reference levels to be available during normal operation.

Figure 1:
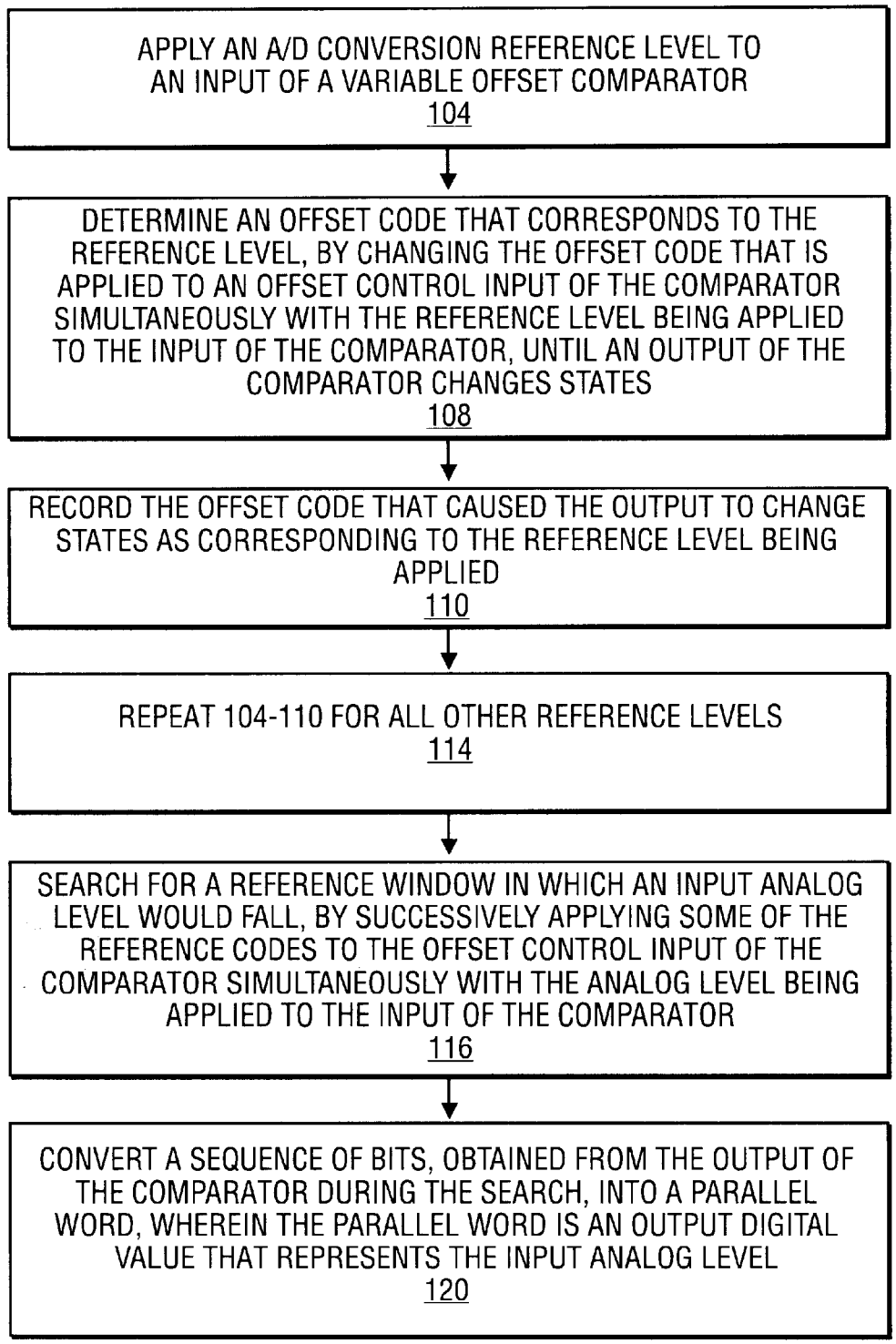
FIG. 1 shows a flow diagram of an embodiment of an A/D conversion process.

FIG. 1 shows a flow diagram of an embodiment of an A/D conversion process in which an input analog level is converted into an output digital value. The process begins with operation 104 by applying an A/D conversion reference level to an input of the VOC. This reference level may be, for example, a voltage selected from a number of equi-spaced voltages, such as the exemplary seven (7) reference levels shown in FIG. 2.

The VOC has a substantially variable offset that is controllable to represent an implied, variable voltage (which may also be referred to as an implied, VOC reference voltage) against which the input voltage is effectively, but not actually, compared by the VOC. The VOC has an offset control input to receive an offset code that may be a binary number. For example, as an eight bit binary number, the offset code can range from decimal 0 to 255. The implied, VOC reference voltage is varied by changing the offset code fed to the VOC from 0 to 255. Different embodiments of the VOC are described in U.S. patent application Ser. No. 09/895,625, filed Jun. 29, 2001, entitled "Variable Offset Amplifier", which is assigned to the same assignee as that of the present application. The A/D conversion process continues with operation 108.

In operation 108, the offset code that corresponds to the reference level is determined. This can be done by sweeping the offset code that is being applied to the offset control input of the VOC, simultaneously with applying the reference level to the VOC input. The VOC output, which, for example, may exhibit either a logic '1' or logic '0' value, is monitored to detect when it changes states. When the output changes states, the offset code that caused this change is captured and recorded (operation 110). This recorded offset code corresponds to the reference level being applied to the VOC input, and may be referred to as a reference offset code.

Operations 104–110 are then repeated for all other A/D conversion reference levels (see, for example, FIG. 2), so that a number of corresponding, reference offset codes are determined. One of ordinary skill in the art will recognize that the VOC should be designed so that its input voltage range exceeds that of the A/D conversion reference levels, to properly convert the reference levels into their corresponding, reference offset codes. In addition, the offset resolution of the VOC (i.e., the step size or least significant bit of the offset code, represented, for example, in volts) will impact the accuracy of the A/D conversion. Smaller step size in the offset code translates into more accurate representations of the A/D reference levels, which in turn yields more accurate A/D conversions. Other techniques for determining the offset code representation of the A/D conversion reference levels, using the VOC, can alternatively be used.

Figure 2:
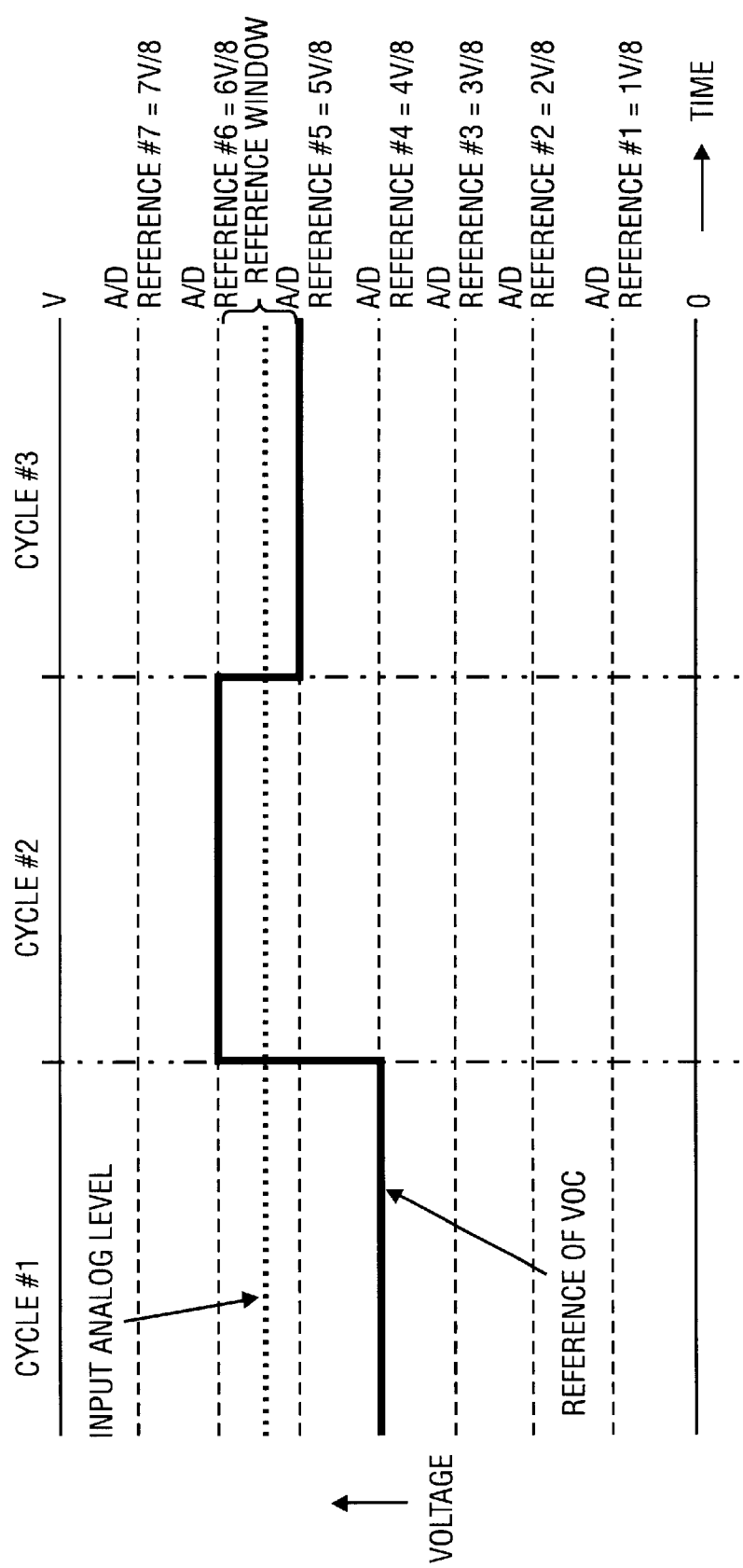
FIG. 2 illustrates the movement of a reference level of a variable offset comparator during an exemplary A/D conversion sequence.

Once the reference offset codes have been determined in operation 114, the input analog level to be converted is applied to the VOC input. Note that the A/D conversion reference levels are not needed during the actual conversion process, since the reference offset codes are sufficient to set the implied reference levels in the VOC. In the example of FIG. 2, the input analog level is a voltage between 5V/8 and 6V/8. The process continues with operation 116 where a search is performed for the reference window in which the input analog level falls. The reference window is defined by a pair of adjacent, reference levels (or their corresponding offset codes). The search may be performed by successively applying some of the reference offset codes to the offset control input of the VOC over a number of cycles, simultaneously with the input analog level being applied the VOC input. In the example of FIG. 2, there are three cycles. A different reference offset code is applied in each cycle of the search, as represented by the bold line. A result of the comparison between the input analog level and the VOC reference in each cycle is recorded. For the embodiment in which the VOC output provides either a logic '1' or a logic '0' as the result of the comparison, each cycle yields one bit.

According to an embodiment, the search is a conventional, binary search. FIG. 2 depicts a binary search sequence. Such a search may in general require N cycles, where N will be the number of bits in the output digital value. Each cycle results in the determination of one bit of the output, multi-bit digital value, starting with the most significant bit and monotonically reducing in significance, to end with a least significant bit of the output digital value.

Referring to FIG. 2, beginning with the first cycle, the full range between the lowest and highest reference offset codes is divided into two, essentially equal, parts. After setting the VOC offset to the reference code that is closest to the midpoint of the range, the VOC is enabled to resolve the comparison, and its output indicates in which part the input analog level lies. The part that does not have the input analog level is then rejected. The process then repeats in the next and subsequent cycles, where the accepted part from a previous cycle is divided into two equal parts and a determination is made as to which part contains the input analog level. This repetitive process continues in successive cycles, until the smallest part has been found (here, in cycle #3). This smallest part is the reference window (between two adjacent, reference offset codes) which contains the analog input level.

Figure 3:
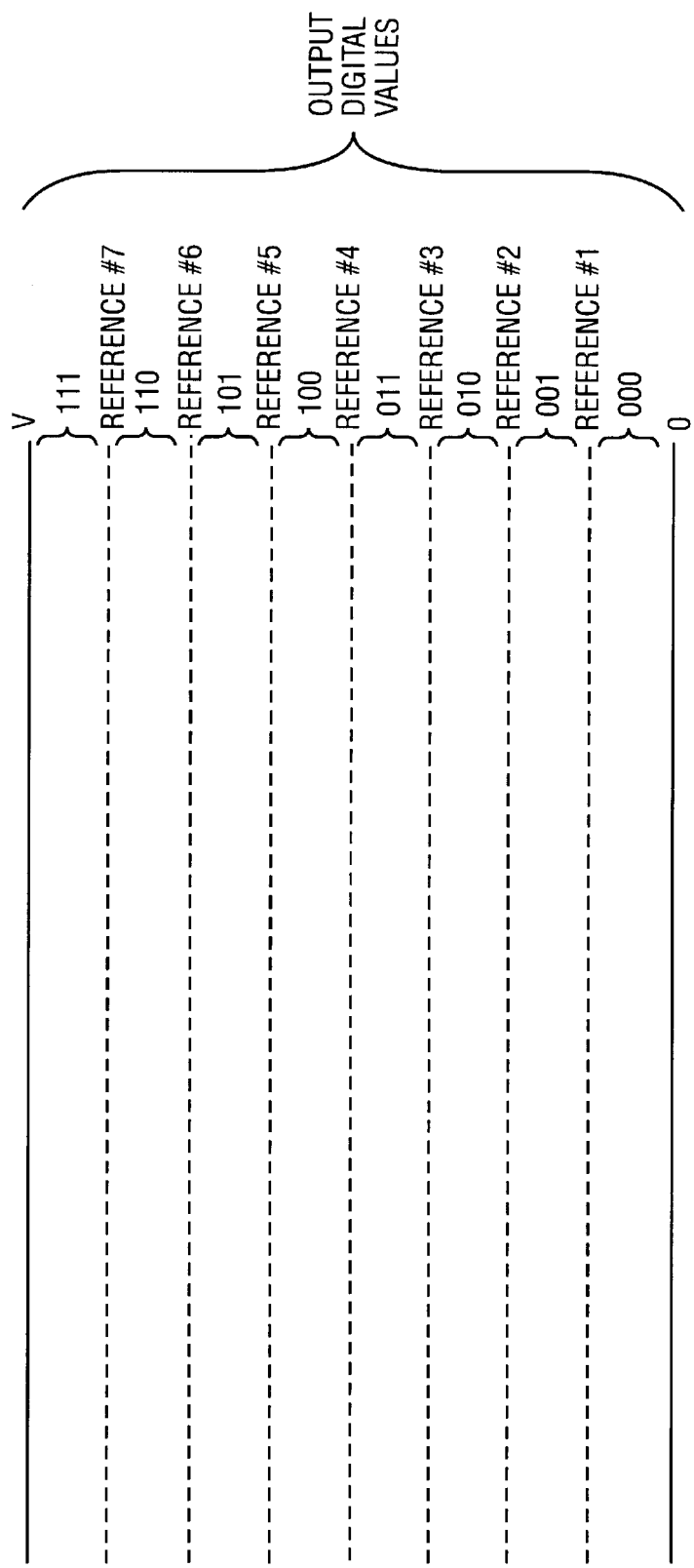
FIG. 3 shows an exemplary set of output digital values and their corresponding reference windows.

When the search for the reference window has been completed, and a sequence of bits deemed the output digital value that represents the input analog level have been obtained from the VOC output during the search, the process ends with operation 120 in which the sequence of bits is converted into a parallel word. FIG. 3 shows all of the possible output digital values for an N=3 bit conversion process, and their corresponding reference windows.

Figure 4:
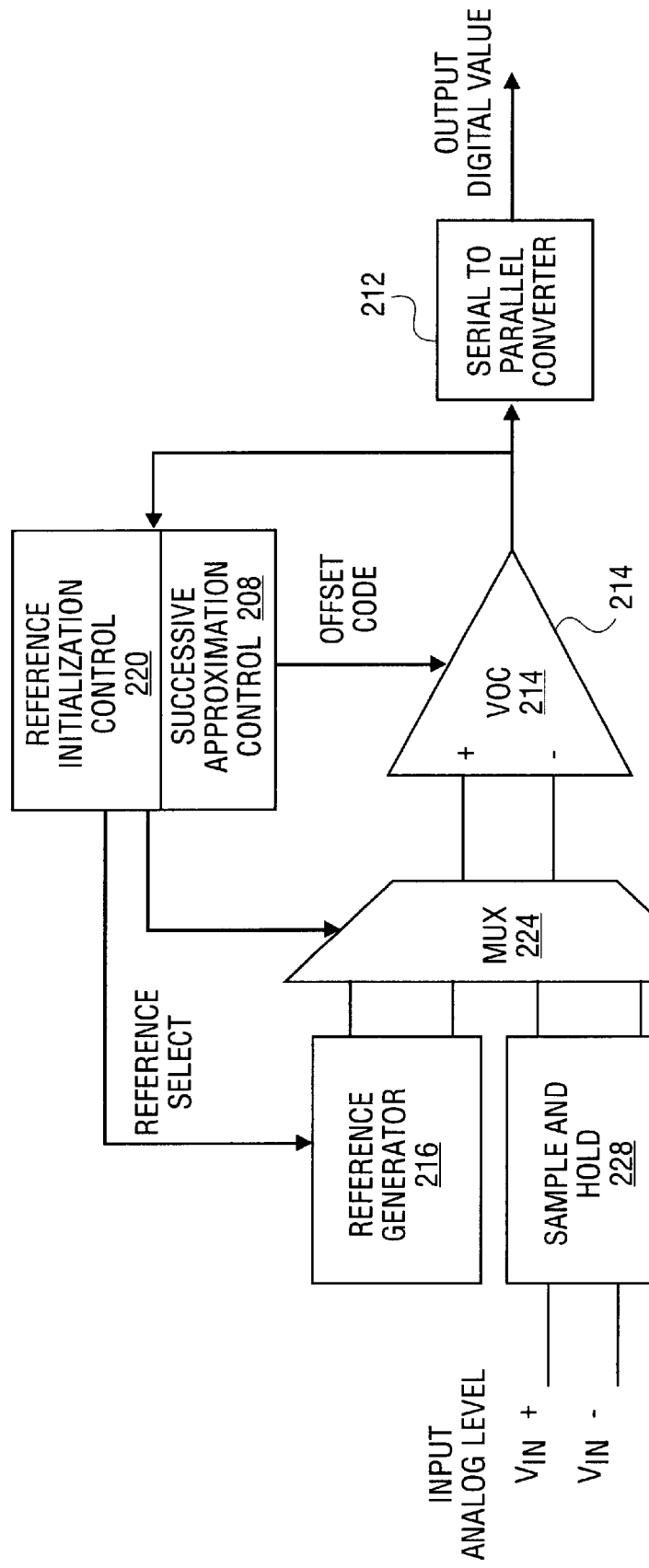
FIG. 4 depicts a block diagram of an embodiment of an A/D converter.

FIG. 4 depicts a block diagram of an embodiment of an A/D converter. The converter includes a VOC 214 that has a substantially variable offset controllable via a digital, offset control input. A pair of inverting and non-inverting input terminals (also referred to as a differential input) are coupled to receive the input analog level to be converted. The offset control input of the VOC 214 is coupled to receive an offset code, which may be a binary number, from a successive approximation control circuit (i.e., SAC) 208.

The SAC 208 has an input coupled to an output of the VOC 214. The SAC 208 is to apply some of a number of reference offset codes, that correspond to a number of predetermined, A/D conversion reference levels, to the offset control input. According to an embodiment, the SAC 208 applies the reference offset codes in accordance with a conventional, binary search for a reference window in which the input analog level would fall. The SAC 208 may be implemented according to conventional, hardwired logic components including, for example, a state machine that responds to each, current offset code setting and VOC output value by generating the next offset code setting (as required by the search).

Performing the binary search results in the output digital value being provided as a sequence of bits at the output of the VOC 214. A serial to parallel converter 212 is coupled to the output of the VOC 214, to deliver a parallel word from the sequence of bits, to complete the A/D conversion process.

To improve the accuracy of the conversion process, a sample and hold circuit 228 may be added, its output being coupled to ensure that a fixed voltage is fed to the input of the VOC 214 during the conversion process.

The conversion process performed by the A/D converter shown in FIG. 4 obtains the predetermined, reference offset codes using a reference initialization control circuit (i.e., RIC) 220. The RIC 220 may be designed, using once again conventional, logic components, to implement the process described above in operations 104–114 of FIG. 1. During such a reference initialization process, the RIC 220 sequentially selects a reference level from those provided by a reference generator 216, to be fed to the input of the VOC 214. The reference generator 216 may, for example, be a resistor string with pass-gate multiplexers. Such a circuit provides any one of a number of reference voltages (such as, for example, the seven (7) levels shown in FIG. 2) at its output, as selected by the RIC 220. A two input multiplexer (i.e. MUX) 224 provides either the reference voltage or the input analog voltage to the input of the VOC 214, depending upon the mode of operation, i.e. reference initialization mode or successive approximation mode.

The RIC 220 and SAC 208 cooperate with each other so that the offset code to the VOC 214 is properly set, to achieve the goals of the reference initialization and successive approximation modes, respectively. For instance, in the reference initialization mode, the SAC 208 is essentially disabled while the RIC 220 determines each of the reference codes. This is done by, for example, sweeping the binary variable that is applied to the offset control input of the VOC 214, while a selected reference level is being applied to he VOC input, until the VOC output changes states. The value of the variable is captured and recorded in response to and as soon as the output changes.

Figure 5:
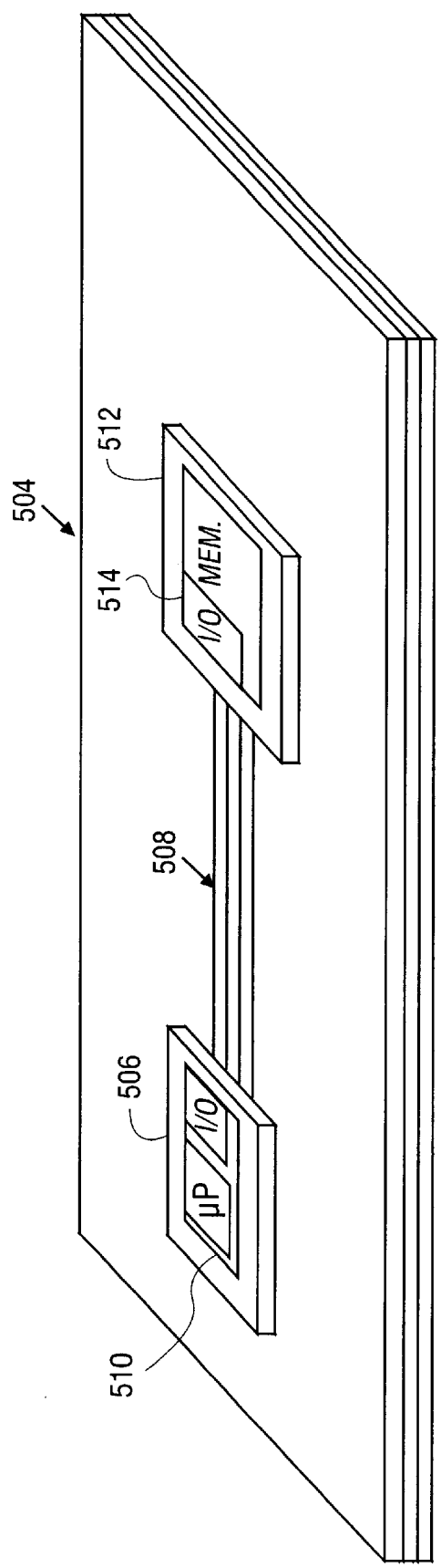
FIG. 5 depicts a block diagram of an embodiment of an electronic system featuring the A/D converter.
Figure 6:
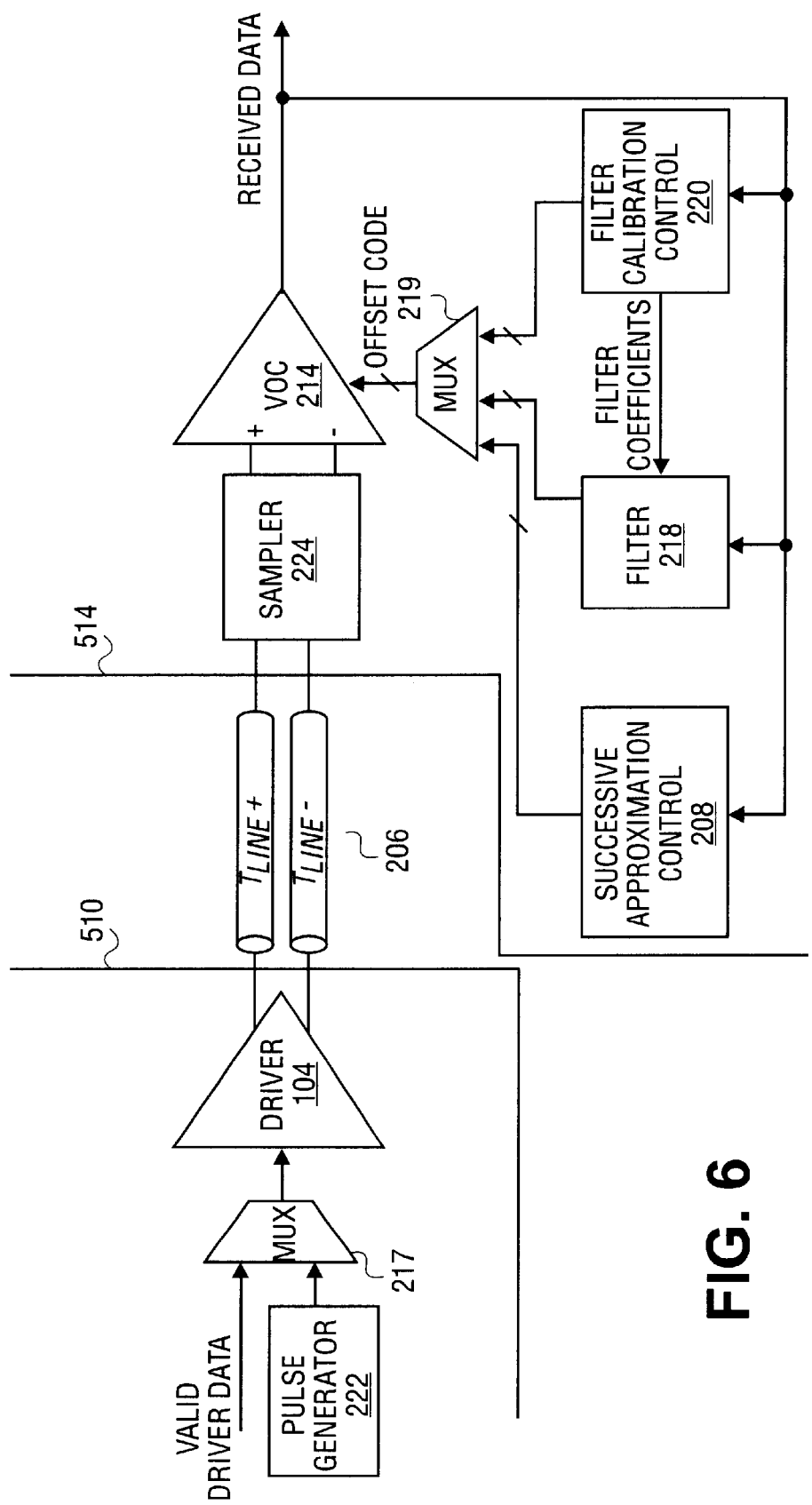
FIG. 6 illustrates a block diagram of how the A/D converter may be integrated into the electronic system.

Turning now to FIG. 5, this figure depicts a block diagram of an embodiment of an electronic system featuring the A/D converter. The electronic system has a communication link that features an equalization loop as described in U.S. patent application Ser. No. 09/967,804, filed Sep. 28, 2001, entitled "Equalization of a Transmission Line Signal Using a Variable Offset Comparator". An A/D converter as described above is integrated with the equalization loop, as depicted in FIG. 6 which will be described below. The system in FIG. 5 has a multi-layer printed wiring board 504 on which a parallel bus 508 is formed. The bus 508 may be of the point to point variety, or a multi-drop bus such as those used in a main memory. An integrated circuit (IC) chip package 506 is operatively installed on the board to communicate using the parallel bus 508. The installation of the package 506 may be done by a surface mount technique or via a connector or socket. The package has an IC chip 510 that includes a logic function section, and an I/O section as an interface between the logic function section and the bus 508. The logic function suction may be one of the following well-known devices: a microprocessor, a memory controller, and a bus bridge. Alternatively, other devices that can be implemented in the logic function section of an IC chip may be used. The I/O section has a bus receiver in which an equalization loop is provided.

A second IC package 512 is also installed on the board 504 to communicate with the first package 506 via the bus 508. The second IC package 512 also includes a chip 514 having an I/O section in which a bus receiver is provided to interface the bus 508, and its own logic function section (here shown as a memory controller).

According to an embodiment, the I/O interfaces of the two chips 510 and 514 communicate with each other bi-directionally, that is using the same conductive lines of the bus for both transmitting and receiving data. Thus, in such an embodiment, drivers are provided, in both IC chips, that are connected to the same conductive lines of the bus 508. Other system applications of the equalization loop are possible, including, for example, a cable receiver.

Referring now to FIG. 6, this figure illustrates a block diagram of how the A/D converter may be integrated into an equalization loop in the I/O section of the IC die 514 (see FIG. 5). FIG. 6 also shows that the equalization loop connects to a transmission line 606 (representing part of the parallel bus 508 in FIG. 5) which is driven by a driver 604 in the IC die 510. The MUX 617, pulse generator 622, the equalization loop and their operation are described, in detail, in U.S. patent application Ser. No. 09/967,804 identified above, and therefore need not be further discussed here, except to note how the SAC 208 may be integrated into the loop. The output of the SAC 208 is fed to an input of a MUX 619. Additional inputs of the MUX 619 are used by the filter 618 and filter calibration control circuit (i.e. FCC) 620. The SAC 208, FCC 620, and filter 618 are designed to cooperate with each other such that each can control the offset code that is fed to the VOC 214, to achieve the respective goals of A/D conversion (as described above in the present application), filter calibration, and equalization. In addition, the RIC 220, reference generator 216, and MUX 224 (see FIG. 4) may be added into the IC die 514 to provide an additional input to the sampler 624. This gives an on-chip capability of determining the A/D conversion reference offset codes.

To summarize, various embodiments of a method and apparatus for A/D conversion using a variable offset comparator have been described. In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for A/D conversion, comprising:
   determining a plurality of binary numbers that correspond to a plurality of reference levels, respectively, by changing a binary variable that is applied to an offset control input of a comparator that has a variable offset, simultaneously with each of the plurality of reference levels being applied to an input of the comparator, until an output of the comparator changes states; and
   performing a search for a reference window in which an input analog level would fall, by successively applying some of the determined plurality of binary numbers to the offset control input of the comparator simultaneously with the analog level being applied to the input of the comparator.

2. The method of claim 1 further comprising:
   converting a sequence of bits, obtained from the output of the comparator during the search, into a parallel word.

3. The method of claim 2 wherein the search is a binary search and the sequence of bits obtained from the output of the comparator starts with a most significant bit of the output digital value and monotonically reduces in significance, to end with a least significant bit of an output digital value that represents the input analog level.

4. An A/D converter comprising:
   a comparator having a variable offset that is controllable via an offset control input, the comparator having an input to receive an input analog level; a multiplexer having an output coupled to the comparator input and an input coupled to receive the input analog level;
   a successive approximation control circuit having an input coupled to an output of the comparator and an output coupled to apply some of a plurality of binary numbers, that correspond to a plurality of A/D conversion reference levels, respectively, to the offset control input; a reference generator coupled to provide one of the plurality of reference levels to a further input of the multiplexer; and
   a reference initialization control circuit having an input coupled to the comparator output and a plurality of outputs coupled to control the multiplexer, the reference generator, and the comparator, to determine the plurality of binary numbers.

5. The A/D converter of claim 4 wherein the successive approximation control circuit is to apply some of the plurality of binary numbers in accordance with a binary search for a reference window in which the input analog level would fall.

6. The A/D converter of claim 4 wherein the comparator input is differential, to receive the input analog level as a differential level.

7. The A/D converter of claim 6 further comprising:
   a serial to parallel bit converter coupled to the output of the comparator.

8. The A/D converter of claim 4 further comprising:
   a sample and hold circuit having an output coupled to provide the comparator input with the input analog level.

9. The A/D converter of claim 4 wherein the reference initialization control circuit is to determine the plurality of binary numbers by changing a binary variable that is applied to the offset control input simultaneously with each of the plurality of reference levels being applied to an input of the comparator, until an output of the comparator changes states.

10. An electronic system comprising:
    a printed wiring board on which a parallel bus is formed, an integrated circuit (IC) chip package being operatively installed on the board to communicate using the parallel bus, the package having an IC chip that includes a logic function section and an I/O section, the I/O section being an interface between the logic function section and the bus, the I/O section having a bus receiver in which an equalization loop has an A/D converter therein which includes a comparator that has an input coupled to receive a parallel bus signal, the comparator having a variable offset that is controllable via an offset control input, the I/O section further includes a successive approximation control circuit having an input coupled to an output of the comparator and an output coupled to apply some of a plurality of binary numbers, that correspond to a plurality of A/D converter reference levels, respectively, to the offset control input.

11. The system of claim 10 wherein the successive approximation control circuit is to apply some of the plurality of binary numbers in accordance with a binary search for a reference window in which the input analog level would fall.

12. The system of claim 10 wherein the comparator input is differential.

13. The system of claim 10 wherein the logic function section is a microprocessor.

14. The system of claim 10 wherein the logic function section is a memory controller.

15. The system of claim 10 wherein the logic function section is a bus bridge.

16. The system of claim 10 wherein the comparator has first and second differential transistor pairs each being intentionally unbalanced, each pair having first and second output nodes, the first output node of the first pair being coupled to the second output node of the second pair, the second output node of the first pair being coupled to the first output node of the second pair; and first and second variable current generators coupled to control respective tail currents of the first and second differential pairs.

17. The system of claim 16 wherein the first and second variable current generators are digitally controllable and can be selectively controlled to increase or decrease the tail currents to change the offset of the comparator to correspond to one of the plurality of A/D converter reference levels.

18. A method for A/D conversion, comprising:

applying an A/D conversion reference level to a differential input of a variable offset comparator;

determining an offset code that corresponds to the reference level applied, by changing an offset code variable that is applied to an offset control input of the comparator simultaneously with the reference level being applied to the input of the comparator, until an output of the comparator changes states;

recording the offset code that caused the comparator output to change states as corresponding to the reference level being applied; and repeating the previous operations for all other A/D conversion reference levels.

19. The method of claim 18 further comprising:

applying an analog level, to be digitized, to the differential input of the comparator;

searching for a reference window in which the analog level would fall, by successively applying some of the recorded offset codes that correspond to the A/D conversion reference levels, to the offset control input of the comparator simultaneously with the analog level being applied to the differential input; and converting a sequence of bits, obtained from the output of the comparator during the search for the reference window, into a parallel word that represents the analog level, as digitized.

* * * * *